(12) United States Patent  
Wilcox

(10) Patent No.: US 7,312,513 B1
(45) Date of Patent: Dec. 25, 2007

(54) ANTIFUSE CIRCUIT WITH WELL BIAS TRANSISTOR

(76) Inventor: William J. Wilcox, 2104 W. Andrew Creek St., Meridian, ID (US) 83642

( * ) Notice: Subject to any disclaimer, the term of this patent is extended or adjusted under 35 U.S.C. 154(b) by 0 days.

(21) Appl. No.: 11/456,366

(22) Filed: Jul. 10, 2006

(51) Int. Cl.
H01L 29/76 (2006.01)

(52) U.S. Cl. .................... 257/530; 356/225.7; 257/50; 438/131

(58) Field of Classification Search ............... 257/50, 257/131, 467, 530; 327/525; 438/131, 467, 438/600, 601
See application file for complete search history.

(56) References Cited

U.S. PATENT DOCUMENTS

| | | | |
|---|---|---|---|
| 5,680,360 A * | 10/1997 | Pilling et al. ........... 365/225.7 |
| 6,351,425 B1 * | 2/2002 | Porter .................... 365/225.7 |
| 6,515,344 B1 * | 2/2003 | Wollesen .................. 257/530 |
| 6,515,931 B2 * | 2/2003 | Marr et al. .............. 365/225.7 |
| 6,936,909 B2 * | 8/2005 | Marr et al. ................. 257/530 |
| 6,985,387 B2 * | 1/2006 | Chen et al. ............ 365/189.01 |
| 7,157,782 B1 * | 1/2007 | Shih et al. .................. 257/530 |
| 2005/0024973 A1 * | 2/2005 | Porter et al. ............ 365/225.7 |

* cited by examiner

Primary Examiner—Thao X. Le
Assistant Examiner—Paul E Patton

(57) ABSTRACT

An antifuse circuit includes a terminal, an antifuse transistor, and a bias transistor. The antifuse transistor is formed on a substrate. The antifuse transistor is coupled to the terminal and includes a first gate terminal coupled to receive a first select signal. The bias transistor is coupled between the substrate and a bias voltage terminal. The bias transistor has a second gate terminal and is operable to couple the bias voltage terminal to the substrate responsive to an assertion of a bias enable signal at the second gate terminal.

30 Claims, 4 Drawing Sheets

ANTIFUSE CIRCUIT WITH WELL BIAS TRANSISTOR

CROSS-REFERENCE TO RELATED APPLICATIONS

Not applicable.

STATEMENT REGARDING FEDERALLY SPONSORED RESEARCH OR DEVELOPMENT

Not applicable

BACKGROUND OF THE INVENTION

The present invention relates generally to integrated circuits and, more particularly, to an antifuse circuit with a snapback select transistor.

Integrated circuits are interconnected networks of electrical components fabricated on a common foundation called a substrate. The electrical components are typically fabricated on a wafer of semiconductor material that serves as the substrate. Various fabrication techniques, such as layering, doping, masking, and etching, are used to build millions of resistors, transistors, and other electrical components on the wafer. The components are then wired together, or interconnected, to define a specific electrical circuit, such as a processor or a memory device.

Fusible elements are employed in integrated circuits to permit changes in the configuration of the integrated circuits after fabrication. For example, fusible elements may be used to replace defective circuits with redundant circuits. Memory devices are typically fabricated with redundant memory cells. The redundant memory cells may be enabled with fusible elements after fabrication to replace defective memory cells found during a test of the fabricated memory device. Fusible elements may also be used to customize the configuration of a generic integrated circuit after it is fabricated, or to identify an integrated circuit.

One type of fusible element is a polysilicon fuse. The polysilicon fuse comprises a polysilicon conductor fabricated to conduct electrical current in an integrated circuit. A portion of the polysilicon fuse may be evaporated or opened by a laser beam to create an open circuit between terminals of the polysilicon fuse. The laser beam may be used to open selected polysilicon fuses in an integrated circuit to change its configuration. The use of polysilicon fuses is attended by several disadvantages. Polysilicon fuses must be spaced apart from each other in an integrated circuit such that when one of them is being opened by a laser beam the other polysilicon fuses are not damaged. A bank of polysilicon fuses therefore occupies a substantial area of an integrated circuit. In addition, polysilicon fuses cannot be opened once an integrated circuit is placed in an integrated circuit package, or is otherwise encapsulated.

Another type of fusible element is an antifuse. An antifuse includes two conductive terminals separated by an insulator or a dielectric, and is fabricated as an open circuit. The antifuse is programmed by applying a high voltage across its terminals to rupture the insulator and form an electrical path between the terminals. One type of antifuse may be implemented using a transistor. Under high voltage, a short is created at the drain/substrate junction. The electrical path created by programming the antifuse can later be detected and used as the basis for configuring the device.

Antifuses have several advantages that are not available with typical fuses. A bank of antifuses takes up much less area of an integrated circuit because they are programmed by a voltage difference that can be supplied on wires connected to the terminals of each of the antifuses. The antifuses may be placed close together in the bank, and adjacent antifuses are typically not at risk when one is being programmed. Antifuses may also be programmed after an integrated circuit is placed in an integrated circuit package, or encapsulated, by applying appropriate signals to pins of the package. This is a significant advantage over polysilicon fuses for several reasons. An integrated circuit may be tested after it is in a package, and may then be repaired by replacing defective circuits with redundant circuits by programming selected antifuses. A generic integrated circuit may be tested and placed in a package before it is configured to meet the specifications of a customer. This reduces the delay between a customer order and shipment. The use of antifuses to customize generic integrated circuits also improves the production yield for integrated circuits, because the same generic integrated circuit may be produced to meet the needs of a wide variety of customers.

One issue arising with the use of transistor type antifuses is that the short to substrate created when the antifuse ruptures can cause interference with the programming or reading of other antifuses formed on the same substrate. When the program voltage is applied to the antifuse, the device enters a snapback mode of operation prior to the dielectric being ruptured. Since snapback operation results in a local voltage lift of the substrate, an adjacent unselected antifuse may also go into snapback due to the voltage lift.

This section is intended to introduce various aspects of art that may be related to various aspects of the present invention described and/or claimed below. This section provides background information to facilitate a better understanding of the various aspects of the present invention. It should be understood that the statements in this section of this document are to be read in this light, and not as admissions of prior art. The present invention is directed to overcoming, or at least reducing the effects of, one or more of the issues set forth above.

BRIEF SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One aspect of the present invention is seen in an antifuse circuit including a terminal, an antifuse transistor, and a bias transistor. The antifuse transistor is formed on a substrate. The antifuse transistor is coupled to the terminal and includes a first gate terminal coupled to receive a first select signal. The bias transistor is coupled between the substrate and a bias voltage terminal. The bias transistor has a second gate terminal and is operable to couple the bias voltage terminal to the substrate responsive to an assertion of a bias enable signal at the second gate terminal.

Another aspect of the present invention is seen in a method for programming an antifuse. The method includes providing an antifuse transistor formed above a substrate and enabled responsive to a first select signal coupled to a terminal. A select transistor is coupled between the antifuse transistor and a ground potential and enabled responsive to a second select signal. A bias transistor is coupled between the substrate and a bias voltage source and enabled responsive to a bias enable signal to couple the bias voltage source to the substrate. A program voltage is provided at the terminal. The bias enable signal is asserted to couple the substrate to the bias voltage source. The first and second select signals are asserted to program the first antifuse.

BRIEF DESCRIPTION OF THE SEVERAL VIEWS OF THE DRAWINGS

The invention will hereafter be described with reference to the accompanying drawings, wherein like reference numerals denote like elements, and.

Figure 1:
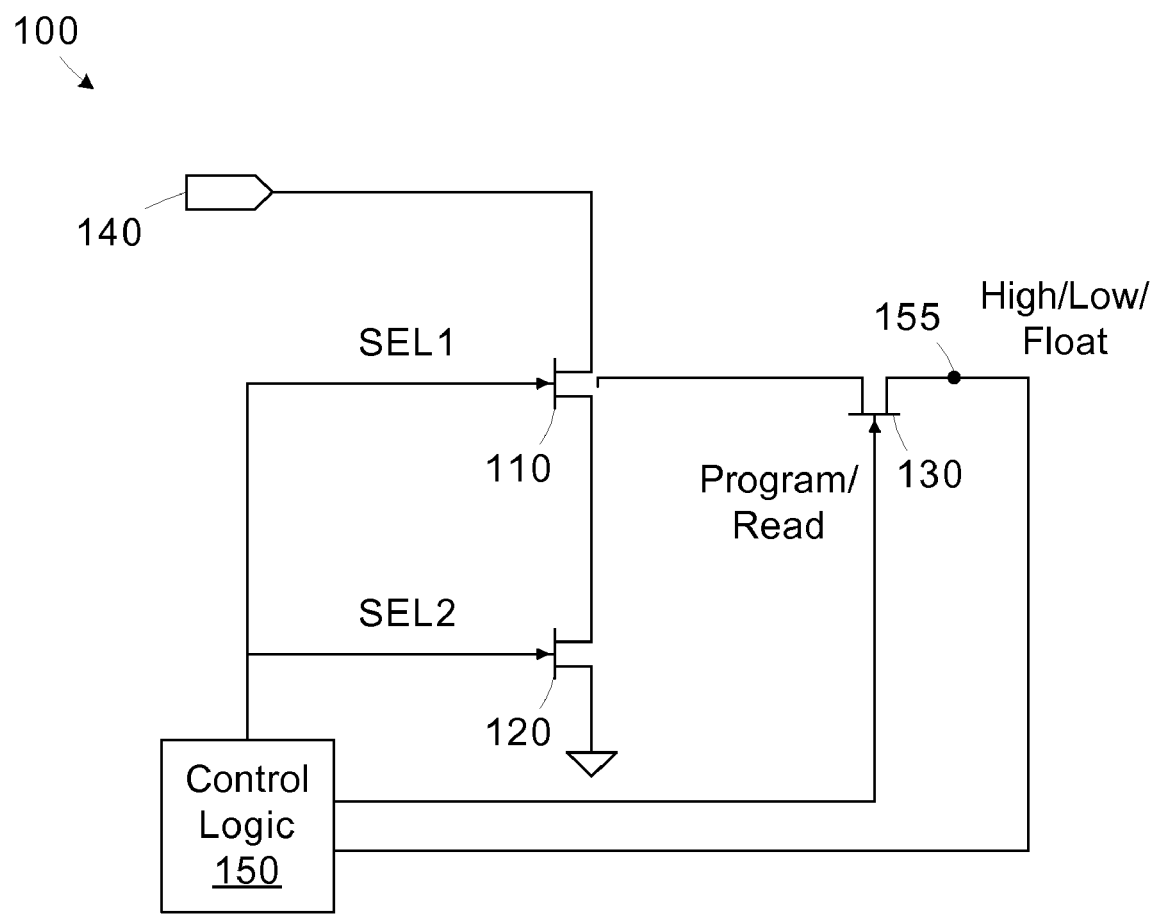
FIG. 1 is a diagram of an antifuse programming circuit in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

One or more specific embodiments of the present invention will be described below. It is specifically intended that the present invention not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the present invention unless explicitly indicated as being "critical" or "essential."

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to the drawings wherein like reference numbers correspond to similar components throughout the several views and, specifically, referring to FIG. 1, the present invention shall be described in the context of an exemplary antifuse circuit 100. The antifuse circuit 100 includes an antifuse transistor 110, a select transistor 120, a bias transistor 130, a program terminal 140, and control logic 150. In the illustrated embodiment, antifuse transistor 110, select transistor 120, and bias transistor 130 are n-channel devices. Of course, other types of transistors, such as p-type transistors, may be used depending on the particular implementation.

The terminal 140 is coupled to the antifuse transistor 110 to allow a program voltage to be applied to the antifuse transistor 110. In one embodiment, the terminal 140 may be an external pin of the device with which the antifuse circuit 100 is associated. The control logic 150 is provided for generating various select signals for programming and/or reading the antifuse transistor 110.

To program the antifuse transistor 110, a program voltage may be applied to the terminal 140, and the antifuse transistor 110 may be enabled by asserting the SEL1 signal. The select transistor 120 may be enabled by asserting the SEL2 signal, thereby creating a path to ground through the antifuse transistor 110 and the select transistor 120. The program voltage causes antifuse transistor 110 to enter a snapback mode of operation. In a snapback mode of operation, the antifuse transistor 110 exhibits increased current conduction with a given applied voltage, as compared to a transistor operating in the normal mode below its breakdown voltage. This increased current passing through the antifuse transistor 110 ruptures the drain/substrate junction of the antifuse transistor 110, causing a short between the drain of the antifuse transistor 110 and the substrate. Because the antifuse transistor 110 is sized to be small, the high current seen during snapback operation causes migration of material and melting, resulting in a short between the drain/substrate. For this reason, the gate insulating layer of the antifuse transistor 110 is relatively thick, and the drain contact-to-gate spacing is relatively large so any heating effect due to the high current during programming does not damage the gate.

The bias transistor 130 is coupled to the substrate of the antifuse transistor 110 and controlled by the control logic 150 to determine a bias applied to the substrate at a bias voltage terminal 155. In one embodiment, the control logic 150 applies a positive bias voltage to the substrate during a program cycle and grounds the substrate during a subsequent read cycle. The control logic 150 disables the bias transistor 130 and allows the substrate to float during the programming of other antifuses.

The relative breakdown voltages of the antifuse transistor 110 and the select transistor 120 are tailored to achieve the desired snapback mode of operation for the antifuse transistor 110. For example, if the program voltage is approximately 5V, the breakdown voltage of the antifuse transistor 110 may be approximately 4–4.5V.

Figure 2:
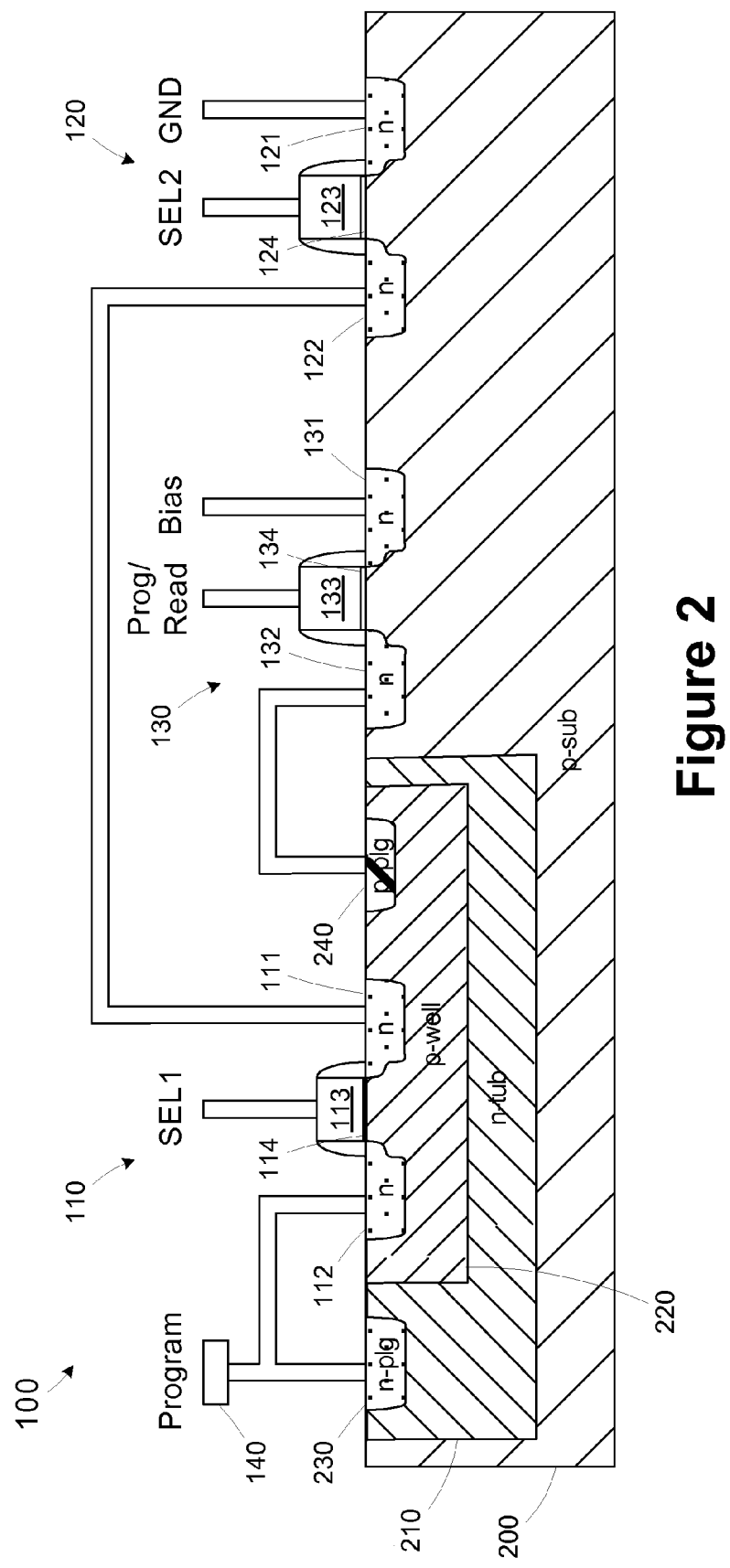
FIG. 2 is a cross-section view of the devices used in the programming circuit of FIG. 1.

Turning now to FIG. 2, a cross section view of the antifuse circuit 100 is provided. The transistors 110, 120, 130 are formed above a substrate 200. To provide isolation for the antifuse transistor 110 from other nearby antifuses, a tub 210 is formed in the substrate, and a well 220 is formed within the tub 210 using well known implantation techniques. The antifuse transistor 110 includes a source region 111 and drain region 112 defined in the well 220, and a gate stack 113 formed over a gate insulation layer 114. The select transistor 120 and bias transistor 130 also include respective source regions 121, 131, drain regions 122, 132, gate stacks 123, 133, and gate insulation layers 124, 134. In the illustrated embodiment, the antifuse transistor 110, select transistor 120, and bias transistor 130 are n-type transistors. The dopant type of the various elements is shown on FIG. 2 in accordance with this embodiment. In an embodiment where other conductivity types are employed for one or more of the transistors 110, 120, 130, the dopant type may vary.

For ease of illustration and to avoid obscuring the present invention, not all features of the transistors 110, 120, 130 are illustrated. For example, the gate stacks 113, 123, 133 include a conductive gate electrode above the respective gate insulation layers 114, 124, 134. For example, the gate electrode may be comprised of polysilicon, and it may be covered by a silicide layer. The source/drain regions may also include metal silicide regions. Various gate embodiments may be used, and their specific constructs are well known to those of ordinary skill in the art.

In the illustrated embodiment, the antifuse transistor 110 is shown as being a smaller device than the select transistor 120 and the bias transistor 130. These relative illustrations are not intended to represent actual dimensional ratios or differences, but rather only to illustrate that the exemplary antifuse transistor 110 is generally rated to carry less current than the select transistor 120 or bias transistor 130, such that it enters snapback and fails when a program voltage is applied.

As seen in FIG. 2, a plug 230 is formed in the tub 210. The program terminal 140 is coupled to the drain region 112 of the antifuse transistor 110 and the plug 230, so that the tub 210 also sees the program voltage. As a result, the well 220 is isolated from other antifuse circuits formed elsewhere on the substrate 200. The control logic 150 (see FIG. 1) asserts the SEL1 signal to select the antifuse transistor 110 for programming or reading.

The source 111 of the antifuse transistor 110 is coupled to the drain 122 of the select transistor 120, and the source 121 of the select transistor 120 is grounded. The control logic 150 (see FIG. 1) asserts the SEL2 signal to select the select transistor 120 during programming. Also, the control logic 150 deasserts the SEL2 signal after programming to isolate the antifuse transistor 110 and allow it to come out of snapback.

A plug 240 is formed in the well 220 to couple the drain 132 of the bias transistor 130 to the well 220 to allow the control logic 150 to control the bias applied to the well 220. The control logic 150 may apply a voltage to or ground the drain 132 of the bias transistor 130 while asserting the Prog/Read signal to control the bias of the well 220. In one embodiment, the control logic 150 applies a positive bias voltage to the well 220 during programming and grounds the well 220 while reading the antifuse transistor 110. During the programming of other antifuses, the control logic 150 allows the well 220 to float by deasserting the Prog/Read signal.

Adjacent antifuse circuits (e.g., similar to the antifuse circuit 100) are isolated from one another because each antifuse transistor 110 is disposed within its own well 220. The bias of each well 220 may be independently controlled, such that program or read operations conducted on one antifuse circuit 100 does not affect the adjacent antifuse circuits.

Figure 3:
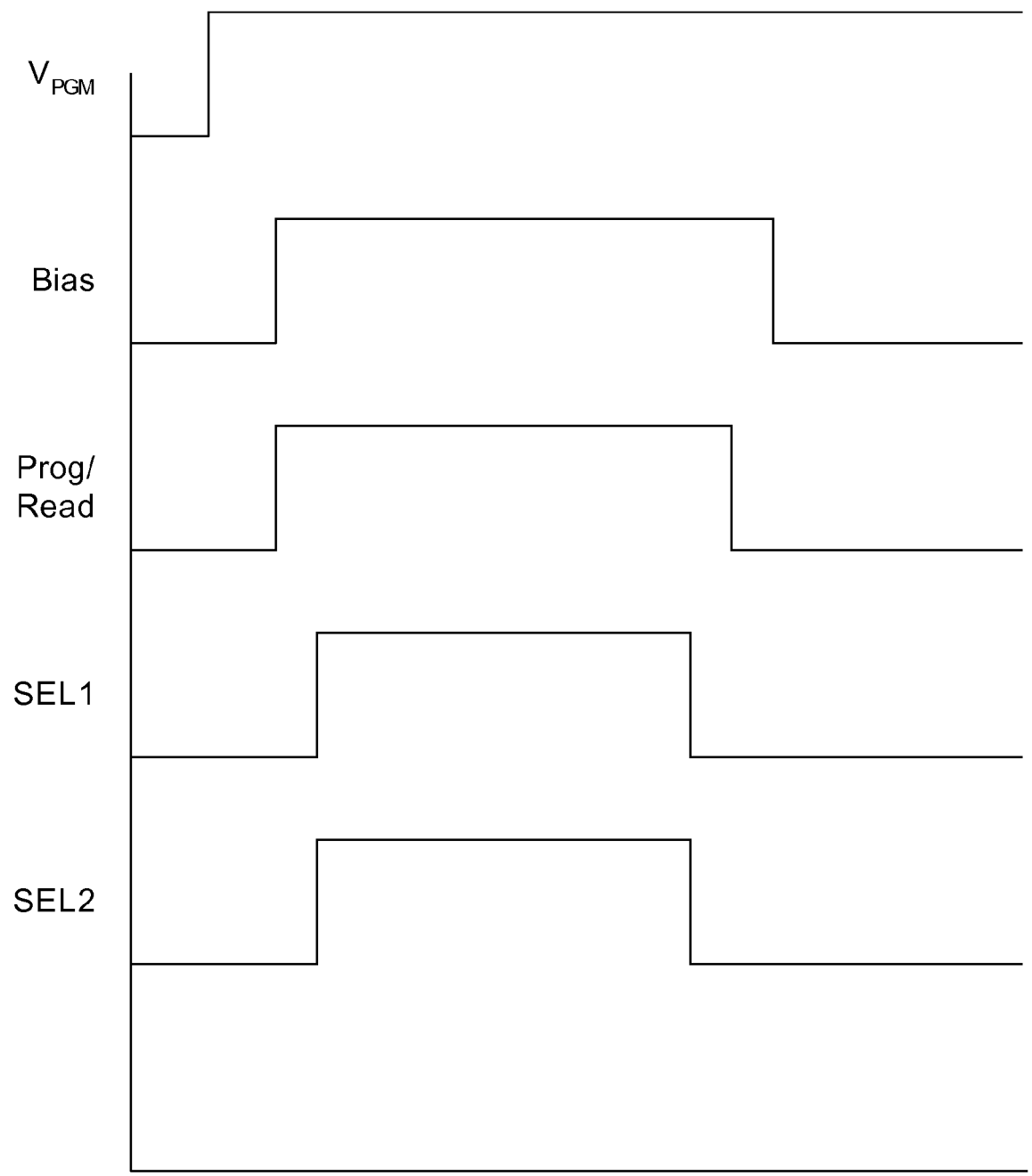
FIG. 3 is a timing diagram illustrating the timing of select signals for programming the antifuse circuit of FIG. 1.

Turning now to FIG. 3, a timing diagram showing the control signals provided for programming the antifuse transistor 110 is provided. The program voltage is asserted at the terminal 140 to initiate the programming operation. The Bias signal is set at a high level, and the Prog/Read signal is asserted to apply the bias voltage to the well 220. The SEL1 and SEL2 signals are asserted to select the antifuse transistor 110 and couple the antifuse transistor 110 to ground through the select transistor 120. The antifuse transistor 110 enters a snapback mode of operation and the drain/well junction ruptures, causing a short between the drain 112 and the well 220. The SEL2 signal is deasserted following a predetermined time interval to allow the antifuse transistor 110 to exit the snapback state.

The length of the predetermined program time interval depends on the particular characteristics of the antifuse circuit 100, including the program voltage, the time required to rupture the antifuse transistor 110, and the soak time required to condition the antifuse transistor 110. Likewise, the particular time intervals between assertions and deassertions of the various signals shown in FIG. 3 depend on the particular implementation and device characteristics. The time intervals illustrated are merely intended to be illustrative of the programming sequence, not the actual relative timing or time periods.

Figure 4:
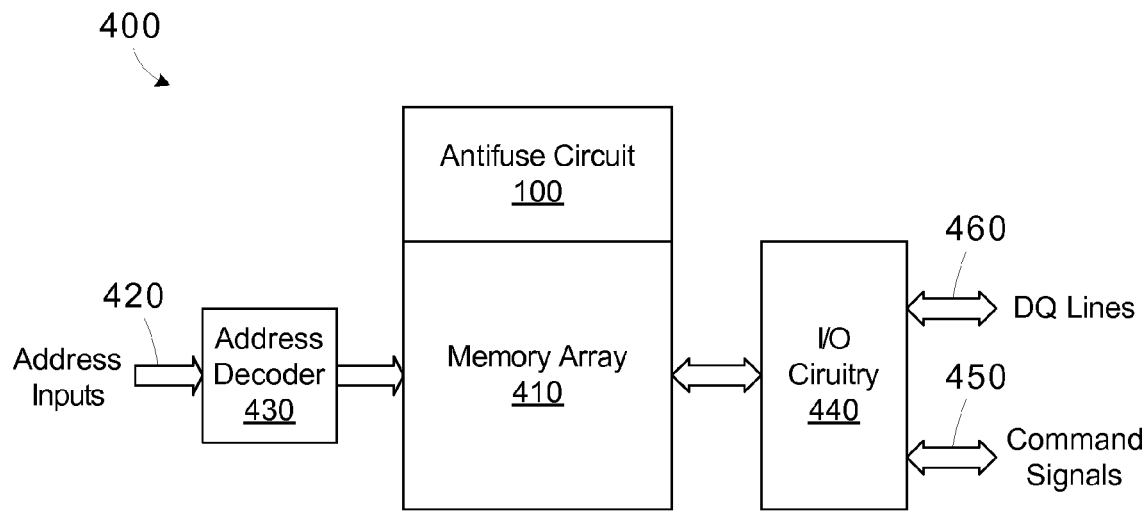
FIG. 4 is a simplified functional block diagram of a memory device incorporating the antifuse circuit of FIG. 1.

Referring now to FIG. 4, a block diagram of a memory device 400 is shown according to another embodiment of the present invention. The memory device 400 includes an array 410 of memory cells that are accessed according to address signals provided to the memory device 400 at a number of address inputs 420. An address decoder 430 decodes the address signals and accesses memory cells in the array 410 according to the address signals. Input/output (I/O) circuitry 440 is provided for controlling read and write events to the memory array 410 in the locations specified by the address inputs 420. Control inputs 450 are provided for defining the type of transaction being conducted (e.g., typical control inputs 450 include a chip enable signal, a write enable signal, and an output enable signal) DQ lines 460 are provided for the exchange of read or write data with the memory array 410. For example, data is written to the memory cells in the array 410 when a write enable signal and a chip enable signal are both low. The data is received by the memory device 400 over the DQ lines 460. The data is provided to the memory cells in the array 410 from the DQ lines 460 through the I/O circuitry 440. Data is read from the memory cells in the array 410 when the write enable signal is high and the output enable signal and the chip enable signal are both low.

The antifuse circuit 100 may be used in the memory device 400 for configuring the memory array 410. For example, defective memory cells may be replaced with redundant cells by programming certain antifuse transistors 110, as is well known in the art. The antifuse circuit 100 may be integrated with the memory array 410 or may be a separate circuit on the memory device 400.

Figure 5:
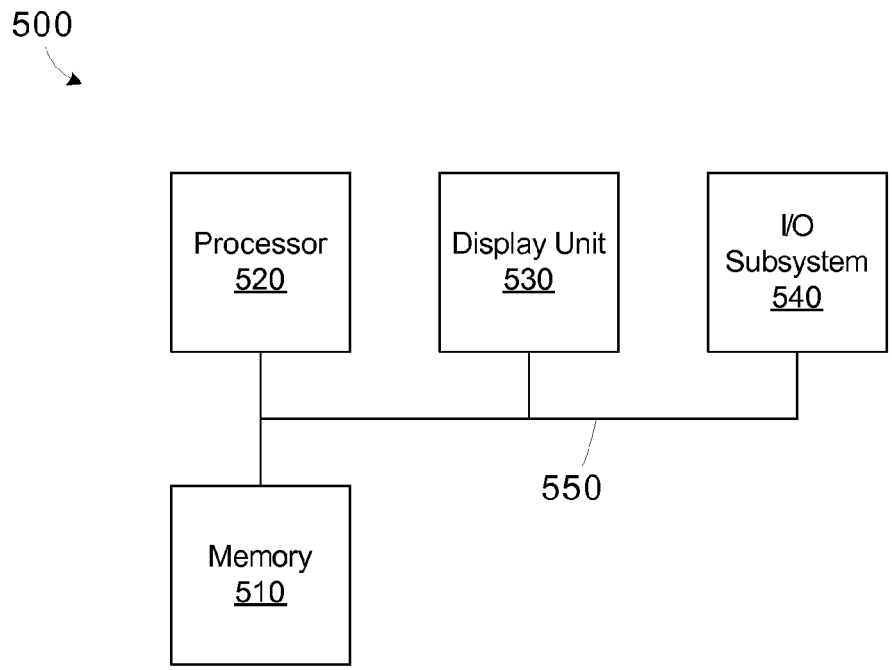
FIG. 5 is a simplified block diagram of an information handling system incorporating the antifuse circuit of FIG. 1.

A block diagram of an information-handling system 500 is shown in FIG. 5 according to yet another embodiment of the present invention. The information-handling system 500 includes a memory system 510, a processor 520, a display unit 530, and an I/O subsystem 540. The processor 520, the display unit 530, the I/O subsystem 540, and the memory system 510 are coupled together by a suitable communication line or bus 550 over which signals are exchanged between them. The processor 520 may be, for example, a microprocessor. One or more of the memory system 510, the processor 520, the display unit 530, and the I/O subsystem 540 may include one or more of the circuits and devices described above with respect to FIGS. 1–4 according to embodiments of the present invention.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

I claim:

1. An antifuse circuit, comprising:
   a terminal;
   an antifuse transistor formed on a substrate, wherein the antifuse transistor is coupled to the terminal and includes a first gate terminal coupled to receive a first select signal; and
   a bias transistor coupled between the substrate and a bias voltage terminal, the bias transistor having a second gate terminal and being operable to couple the bias voltage terminal to the substrate responsive to an assertion of a bias enable signal at the second gate terminal.

2. The antifuse circuit of claim 1, wherein the bias transistor is operable to couple the substrate to a positive voltage at the bias voltage terminal.

3. The antifuse circuit of claim 1, wherein the bias transistor is operable to couple the substrate to a ground potential at the bias voltage terminal.

4. The antifuse circuit of claim 1, further comprising a select transistor coupled to the antifuse transistor having a third gate terminal coupled to receive a second select signal.

5. The antifuse circuit of claim 4, wherein the antifuse transistor operates in a snapback mode of operation in response to an assertion of the first select signal, the second select signal, and a program voltage at the terminal.

6. The antifuse circuit of claim 1, wherein the antifuse transistor is formed above a well having a first conductivity type defined in the substrate, and the bias transistor is coupled to the well.

7. The antifuse circuit of claim 6, wherein the well is disposed within a tub having a second conductivity type different than the first conductivity type defined in the substrate.

8. The antifuse circuit of claim 7, wherein the terminal is coupled to the tub.

9. The antifuse circuit of claim 1, wherein the antifuse transistor and the bias transistor comprise n-channel transistors.

10. An antifuse circuit, comprising:
    a terminal;
    an antifuse transistor formed above a first well defined in a substrate, wherein the first antifuse transistor is coupled to the terminal and includes a first gate terminal coupled to receive a first select signal;
    a select transistor coupled between the antifuse transistor and a ground potential and having a second gate terminal coupled to receive a second select signal; and
    a bias transistor coupled between the first well and a bias voltage terminal and having a third gate terminal coupled to receive a bias enable signal and being operable to couple the bias voltage terminal to the first well responsive to an assertion of a bias enable signal at the third gate terminal.

11. The antifuse circuit of claim 10, further comprising control logic operable to provide the first and second select signals, the bias enable signal, and a bias voltage signal at the bias voltage terminal.

12. The antifuse circuit of claim 11, wherein the control logic is operable to assert the first select signal and the second select signal in the presence of a program voltage at the terminal to program the antifuse transistor.

13. The antifuse circuit of claim 12, wherein the bias voltage signal comprises a positive voltage, and the control logic is operable to assert the bias enable signal during the programming of the antifuse transistor.

14. The antifuse circuit of claim 12, wherein the control logic is operable to deassert the bias enable signal to allow the first well to float during the programming of a different antifuse transistor formed in a second well defined in the substrate.

15. The antifuse circuit of claim 12, wherein the bias voltage signal comprises a ground potential, and the control logic is operable to assert the bias enable signal during the reading of the antifuse transistor.

16. The antifuse circuit of claim 10, wherein the bias transistor is operable to couple the first well to at least one of a positive voltage and a ground potential at the bias voltage terminal.

17. The antifuse circuit of claim 11, wherein the antifuse transistor operates in a snapback mode of operation in response to an assertion of the first select signal, the second select signal, and a program voltage at the terminal.

18. The antifuse circuit of claim 17, wherein the control logic is operable to deassert at least the second select signal after programming of the antifuse transistor to allow the antifuse transistor to exit from the snapback mode of operation.

19. The antifuse circuit of claim 10, wherein the first well has a first conductivity type and is disposed within a tub having a second conductivity type different than the first conductivity type defined in the substrate.

20. The antifuse circuit of claim 19, wherein the terminal is coupled to the tub.

21. The antifuse circuit of claim 10, wherein the antifuse transistor, select transistor, and the bias transistor comprise n-channel transistors.

22. A method for programming an antifuse, comprising:
    providing an antifuse transistor formed above a substrate and enabled responsive to a first select signal coupled to a terminal, a select transistor coupled between the antifuse transistor and a ground potential and enabled responsive to a second select signal, and a bias transistor coupled between the substrate and a bias voltage source and enabled responsive to a bias enable signal to couple the bias voltage source to the substrate;
    providing a program voltage at the terminal;
    asserting the bias enable signal to couple the substrate to the bias voltage source; and
    asserting the first and second select signals to program the first antifuse.

23. The method of claim 22, wherein the antifuse transistor operates in a snapback mode of operation during at least a portion of the programming, and the method further comprises deasserting the second select signal to allow the antifuse transistor to exit from the snapback mode following the programming of the antifuse transistor.

24. The method of claim 22, further comprising deasserting the bias enable signal to allow the substrate to float during the programming of a different antifuse transistor.

25. The method of claim 22, wherein the bias voltage source comprises at least one of a positive voltage and a ground potential.

26. The method of claim 22, wherein providing the antifuse circuit further comprises forming the antifuse transistor above a first well defined in the substrate and coupling the bias transistor to the well.

27. The method of claim 26, wherein providing the antifuse circuit further comprises providing the first well having a first conductivity type and being disposed within a tub having a second conductivity type different than the first conductivity type defined in the substrate.

28. The method of claim 27, wherein providing the antifuse circuit further comprises coupling the terminal to the tub.

29. A memory device, comprising:
an array of memory cells;
an address decoder operable to decode address signals to access the memory cells;
a plurality of input/output lines operable to couple data to the memory cells;
input/output circuitry operable to control the data on the input/output lines based on command signals; and
an antifuse circuit integrated into the array, the antifuse circuit comprising:
a terminal;
an antifuse transistor formed on a substrate, wherein the antifuse transistor is coupled to the terminal and includes a first gate terminal coupled to receive a first select signal; and
a bias transistor coupled between the substrate and a bias voltage terminal, the bias transistor having a second gate terminal and being operable to couple the bias voltage terminal to the substrate responsive to an assertion of a bias enable signal at the second gate terminal.

30. A system, comprising:
a memory system;
a processor;
an input/output subsystem;
a communication line coupling the memory system, processor, and input/output subsystem,
wherein at least one of the memory system, processor, and input/output subsystem includes an antifuse circuit, the antifuse circuit comprising:
a terminal;
an antifuse transistor formed on a substrate, wherein the antifuse transistor is coupled to the terminal and includes a first gate terminal coupled to receive a first select signal; and
a bias transistor coupled between the substrate and a bias voltage terminal, the bias transistor having a second gate terminal and being operable to couple the bias voltage terminal to the substrate responsive to an assertion of a bias enable signal at the second gate terminal.

* * * * *